United States Patent [19]
Vu et al.

[11] Patent Number: 5,643,815
[45] Date of Patent: Jul. 1, 1997

[54] SUPER SELF-ALIGN PROCESS FOR FABRICATING SUBMICRON CMOS USING MICRON DESIGN RULE FABRICATION EQUIPMENT

[75] Inventors: Truc Quang Vu, Signal Hill; Maw-Rong Chin, Huntington Beach, both of Calif.

[73] Assignee: Hughes Aircraft Company

[21] Appl. No.: 484,739

[22] Filed: Jun. 7, 1995

[51] Int. Cl.$^6$ ............................................. H01L 21/8234
[52] U.S. Cl. ................................................. 437/44; 437/45
[58] Field of Search ................................. 437/40–41, 44, 437/45

[56] References Cited

U.S. PATENT DOCUMENTS

| | | | |
|---|---|---|---|
| 5,082,794 | 1/1992 | Pfiester et al. | 437/40 |
| 5,270,232 | 12/1993 | Kimura et al. | 437/41 |
| 5,372,960 | 12/1994 | Davies et al. | 437/44 |
| 5,374,575 | 12/1994 | Kim et al. | 437/44 |
| 5,399,508 | 3/1995 | Nowak | 437/27 |
| 5,472,897 | 12/1995 | Hsu et al. | 437/44 |
| 5,484,743 | 1/1996 | Ko et al. | 437/44 |
| 5,527,722 | 6/1996 | Hutter et al. | 437/34 |

*Primary Examiner*—John Niebling
*Assistant Examiner*—Richard A. Booth
*Attorney, Agent, or Firm*—M. E. Lachman; M. W. Sales; W. K. Denson-Low

[57] ABSTRACT

Submicron channel length FET is fabricated using larger (e.g., 1 micron) design rule fabrication equipment. A polysilicon layer (34) is first formed over an active device region (28). The following transistor elements are then sequentially formed using a single mask opening (38): [1] threshold adjust implant (40) by implanting impurity ions into the active device region surface; [2] LDD implant regions (42) by implanting impurity ions into lower portion of the polysilicon layer (38); and [3] source/drain doped implant regions (44) by implanting impurity ions into the upper portion of polysilicon layer (38). A gate opening (60) is next formed in the polysilicon layer (38) and overlying dielectric layer (57) using large design rule lithography to pattern, and then by etching. Sidewall spacers (66) are formed at a submicron distance apart in the gate opening (60), defining gate length (68) therebetween. LDD doped implant regions (42) and source/drain doped implant regions (44) driven-in from polysilicon layer (38) into the active device region (28), forming LDD regions (72) and source/drain regions (74). A gate oxide (63) is grown between spacers (66) in self-align position. A gate polysilicon contact (80) is formed. Metal gate contact (86) is formed directly above the gate polysilicon contact (80), centered over gate oxide (63), providing centered metal-polysilicon contact (87). Metal source/drain contacts (90) and intermediate isolation layer (84) are formed to complete FET. Submicron FET having a reduced length (112) active device region (28) and/or centered gate metal-polysilicon contact (87) is provided.

8 Claims, 6 Drawing Sheets

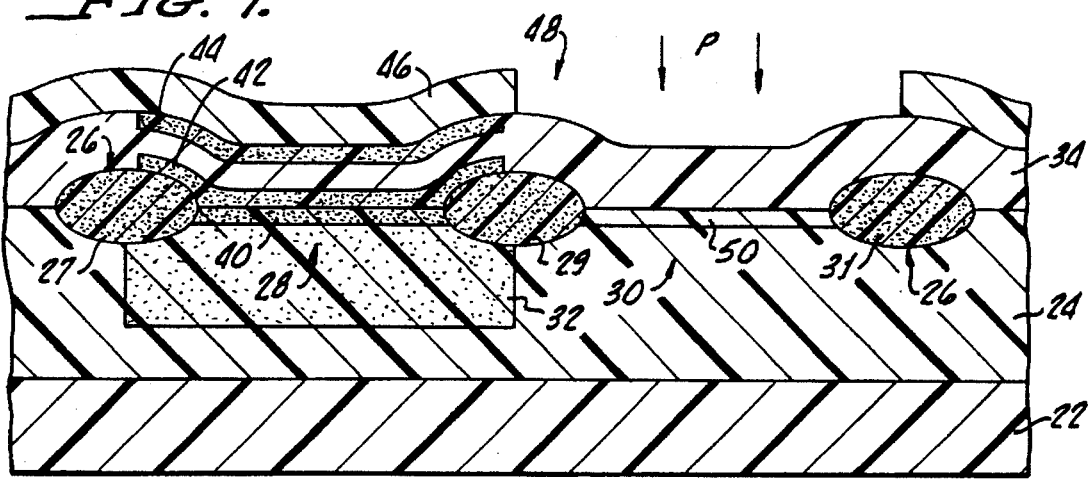
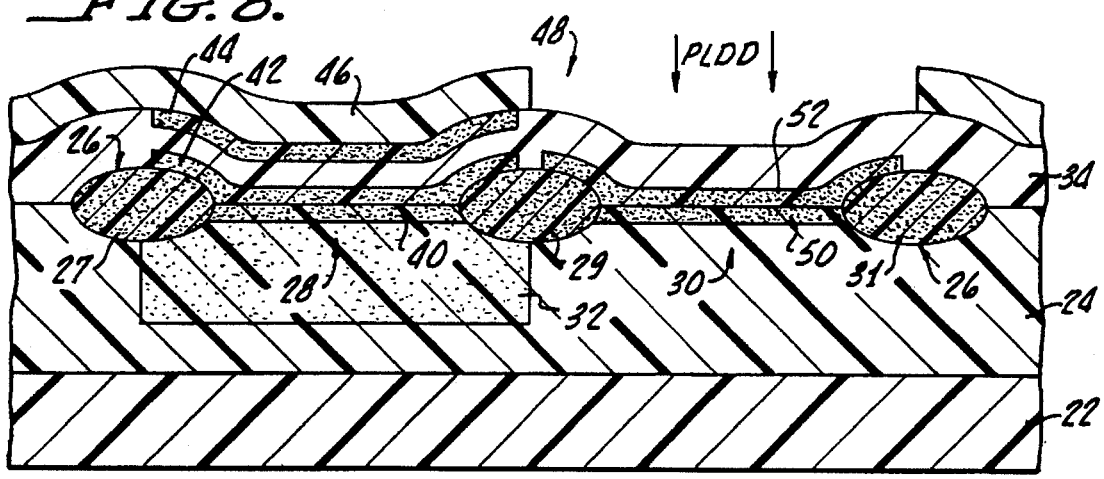
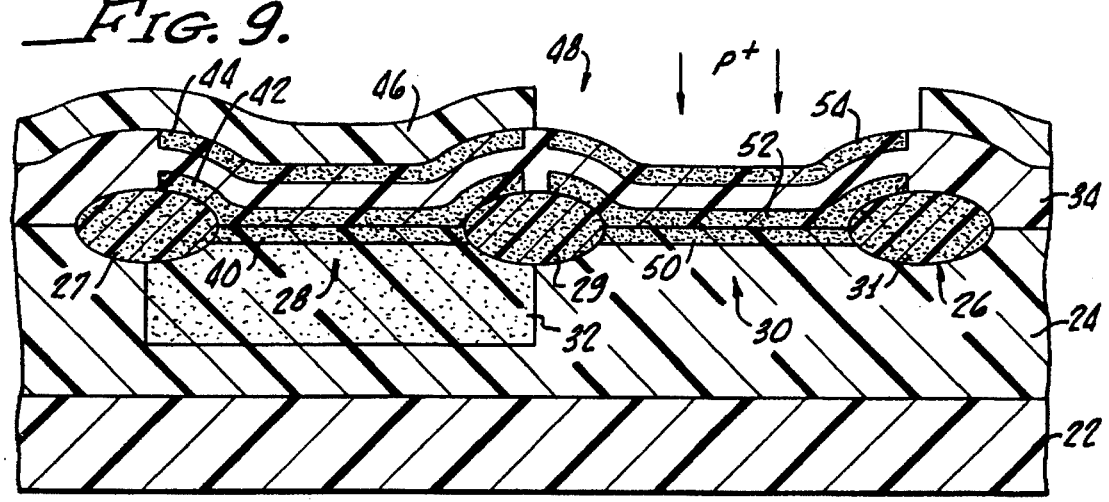

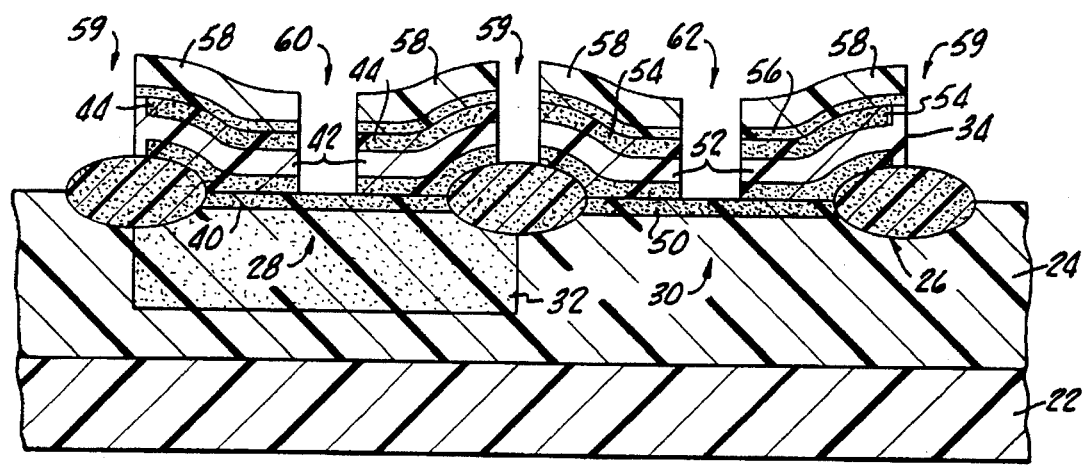
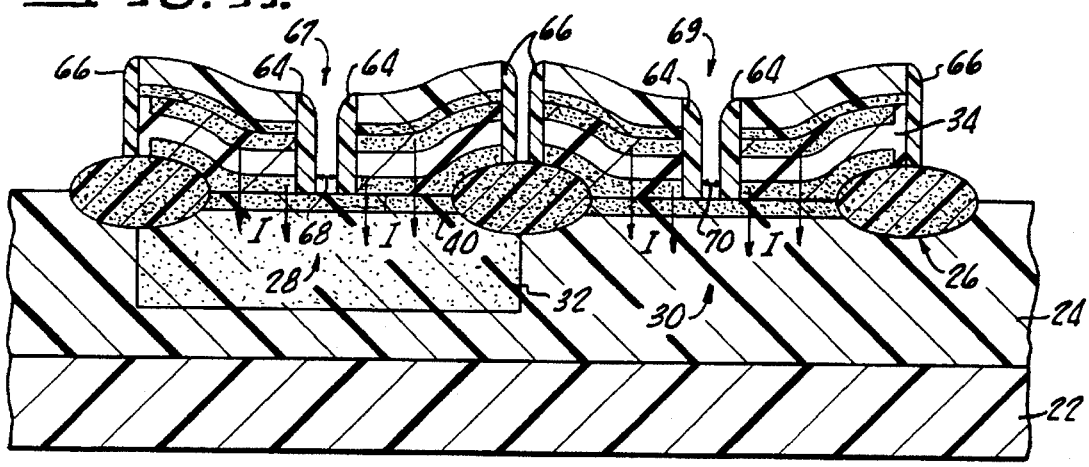
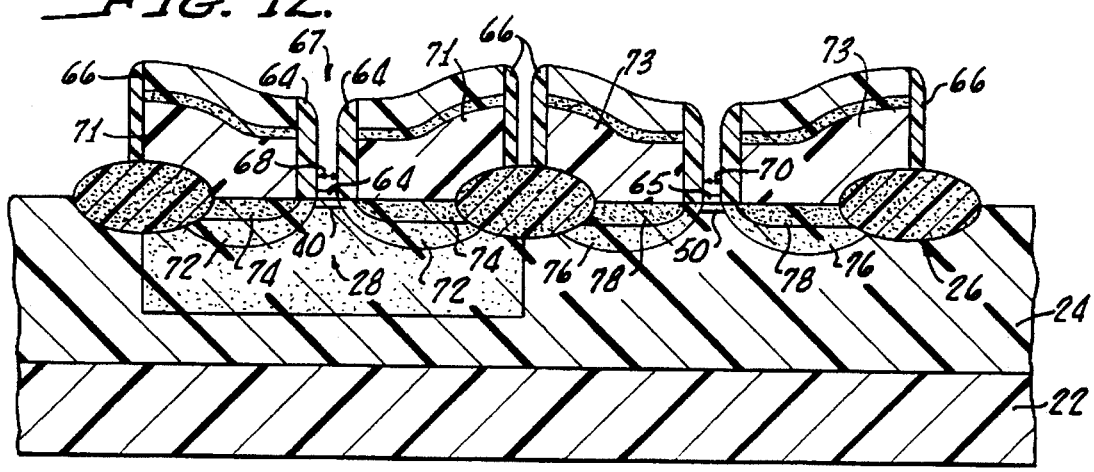

SUPER SELF-ALIGN PROCESS FOR FABRICATING SUBMICRON CMOS USING MICRON DESIGN RULE FABRICATION EQUIPMENT

BACKGROUND OF THE INVENTION

1. Field of the Invention

The present invention relates to semiconductor device and fabrication methods, and more particularly to a process for fabricating short-channel field effect transistors using relatively large design rule fabrication equipment.

2. Description of the Related Art

It is desirable in the production of large scale integrated circuits, or semiconductor chips, to reduce the size of the individual semiconductor devices comprising the circuitry on the chip. This generally provides for an increase in the number of active devices provided on a single wafer or chip and often also provides for a lower overall power requirement for the chip. Short-channel field effect transistors (FETs), having a channel length in the submicron range (less than one millionth of a meter), are one example of semiconductor devices presently sought to be fabricated with reduced size. However, efforts to produce short-channel FETs have generally made use of lithographic techniques requiring expensive, specialized and/or complicated fabrication equipment or processes.

The processes used in the production of semiconductor devices are relatively detailed, sophisticated, and precise. Generally, a semiconductor designer does not have to deal with or modify the details of these processes directly because a set of design rules is provided corresponding to the particular equipment used during the fabrication process. The design rules and electrical parameters are specified or predetermined by the fabrication process and equipment used to make the chip. The designer lays out the semiconductor device structures and circuitry using the design rules to avoid problems associated with tolerance errors of the fabrication equipment. By following the established design rules, the designer does not have to be concerned with the actual details of the tolerance limits of the particular fabrication equipment.

Because the design rule is predetermined by tolerance limits of the particular fabrication equipment, it is based on a minimum semiconductor feature size producible by the equipment with relative reliability. For example, conventional fabrication of short-channel FETs begins with the formation of the gate polysilicon using a relatively precise lithographic step, which is often relatively unreliable, and which uses expensive equipment and/or complicated techniques to define the small gate length. The source and drain areas of the FET are subsequently formed using a self-align technique in which the respective source/drain areas are aligned with the gate polysilicon.

For example, a conventional process for forming a FET with a 0.5 micron gate length usually employs an optical patterning or photo-reduction technique employing a "step and repeat" procedure to define the submicron gate length. An optical stepper or photo-repeater apparatus is used to create an optical mask for patterning a given material layer of the semiconductor device structure. An optical stepper operates with a wavelength corresponding to a given optical resolution. Two standard wavelengths employed by optical steppers are commonly termed "i-line" or "g-line". To produce a 0.5 micron gate length FET a relatively expensive i-line optical stepper is usually required, or a relatively difficult and involved phase shift mask process is required.

Similarly, a process for forming a FET with a gate length approximately below 0.25 micron usually employs x-ray lithographic technology (x-ray lithography) which is very expensive and relatively unreliable.

Accordingly, it would be highly advantageous and desirable to produce reduced size semiconductor devices, including short-channel (submicron) FETs, while using more common, reliable, inexpensive, relatively standard, large design rule semiconductor fabrication equipment available in the industry. In particular it would be desirable to provide for the fabrication of FET devices having a submicron channel or gate length which is well below the design rule tolerance of the fabrication process to used to make the FET.

SUMMARY OF THE INVENTION

An important feature of the fabrication process described herein is the use of large design rule fabrication equipment to form a relatively long-channel gate opening through polysilicon and dielectric layers above an active area and then effectively and significantly decreasing the dimension of the gate opening and the length of the channel by forming dielectric spacers on the opposing sidewalls of the gate opening so that the spacers themselves define a short-channel gate opening that has a length less than can be directly fabricated by the large design rule of fabrication equipment.

In one broad aspect illustrating principles of the present invention, a method of making a semiconductor device structure using relatively large design rule fabrication equipment is provided and comprises the steps of:

(A) providing an active area for a semiconductor device, the active area including an epitaxial layer surface;

(B) forming a first polysilicon layer on the surface of the epitaxial layer;

(C) positioning a mask opening above the first polysilicon layer, in a predetermined position above the active area, and implanting impurity ions into the polysilicon layer to form at least one doped implant region therein;

(F) forming a first dielectric layer above the polysilicon layer;

(G) forming a gate opening through the polysilicon layer and the dielectric layer in a predetermined position above the active area using an etch procedure, the gate opening having dimensions within the tolerances of the large design rule;

(H) forming at least two dielectric spacers on at least two opposing sidewalls of the gate opening using a procedure included within the relatively large design rule process, the dielectric spacers having a distance provided therebetween defining a device gate length which is relatively small compared to the tolerance of the large design rule; and (I) driving-in said at least one doped implant region from the polysilicon layer into the epitaxial layer to form doped active device regions below the epitaxial layer surface which are substantially aligned on opposing sides of the gate length;

wherein the gate area of a semiconductor device is provided between the dielectric spacers having a gate length substantially and relatively smaller than the minimum lithographic feature size of the design rule process used to form the semiconductor device structure.

In another broad aspect illustrating principles of the present invention, a method of making a semiconductor device structure using relatively large design rule fabrication equipment is provided and comprises the steps of:

(A) providing an active area (28, 30) comprising
   a semiconductor substrate (22),
   an epitaxial layer (24) comprising a first conductivity type (N-type) disposed on a surface of said semiconductor substrate (22), and
   at least two field oxide regions (26) disposed at a predetermined distance from each other substantially on the surface of said epitaxial layer (24) providing an active device region (28, 30) therebetween;
(B) forming a first polysilicon layer (34) on the surface of said epitaxial layer (24);
(C) forming a set of impurity ion implants associated with said active device region comprising the substeps of
   (C) (1) forming a temporary blanket resist layer (36) on the surface of said first polysilicon layer (34);
   (C) (2) forming an implant mask opening (38) in said resist mask layer (36) disposed substantially above said active device region (28);
   (C) (3) implanting impurity ions of a second conductivity type (P-type) through said implant mask opening (38) to form threshold adjust region (40) below the surface of said epitaxial layer (24);
   (C) (4) implanting impurity ions of a first conductivity type (N-type) through said implant mask opening (38) such that the ions form a first doped implant region (42) disposed substantially within the lower half of said polysilicon layer (34);
   (C) (5) implanting impurity ions of a first conductivity type ($N^+$-type) through said implant mask opening (38) such that said ions form a second doped implant region (44) disposed substantially within the upper half of said polysilicon layer (34);
   (C) (6) removing the remaining resist layer material (36) from the surface of the polysilicon layer (34);
(E) forming a thin silicide layer (56) the surface of said polysilicon layer (34);
(F) forming a first dielectric layer (58) on the surface of said silicided polysilicon layer (34);
(G) forming a gate opening (60, 62) through said dielectric layer (58) and said polysilicon layer (34), said gate opening being substantially centered in said active area region (28, 30), comprising the substeps of
   (G) (1) forming a temporary resist mask on the surface of said dielectric layer (58) defining the location of said gate opening (60, 62) substantially in the center of said active device area (28);
   (G) (2) etching through the dielectric layer (58) and a substantial portion of the polysilicon layer (34), leaving a relatively thin portion of said polysilicon layer (34) remaining in said gate opening (60,62) above the surface of said active device region (28, 30);
   (G) (3) removing said temporary resist mask from the surface of said dielectric layer (58);
   (G) (4) forming an oxide by converting said thin remaining portion of polysilicon layer (34) in the bottom of said gate opening (60, 62) into silicon dioxide using thermal oxidation;
   (G) (5) etching away said oxide from said thin remaining portion of said polysilicon layer (34) using a dry oxide etch to even out the planar surface of said thin remaining portion of said polysilicon layer (34);
   (G) (6) etching away said thin remaining portions of polysilicon layer (34) in said gate opening (60, 62) using a wet etch solution in which the surface of the active device region (28, 30) is substantially undamaged by the etch solution;
(H) forming at least two sidewall spacers (64) disposed in said gate opening (60, 62) having a predetermined distance therebetween, said distance defining a gate length (68, 70) of said semiconductor device comprising the substeps of
   (H) (1) forming a thin oxide layer on top of the silicon layer in the gate opening (60, 62);
   (H) (2) forming a blanket nitride layer sufficient to fill in the gate openings (60, 62);
   (H) (3) etching away portions of said blanket nitride layer using anisotropic dry etch thereby forming said sidewall spacers (64) from the remaining portions of said blanket nitride layer using said thin oxide layer formed in substep (H) (1) as a stop etch layer;
(I) simultaneously driving-in said first and second doped implant regions (42 and 44) from said polysilicon layer (34) into said active device region (28) to form lightly doped drain regions (72) and source-drain regions (74), respectively;
(J) forming a gate dielectric region (63, 65) disposed between said sidewall spacers (64) on the surface of said epitaxial layer (24), comprising the substeps of
   (J) (1) growing a thin sacrificial oxide layer on the channel surface at the bottom of said gate area (67);
   (J) (2) etching away said sacrificial oxide layer using a hydrofluoric acid solution; and
   (J) (3) growing said gate oxide (63) on the channel surface at the bottom of said gate area (67) using thermal oxidation;
(K) forming first and second polysilicon gates (80, 82), comprising the substeps of
   (K) (1) depositing a second blanket layer of polysilicon material using CVD so that the gate area (67) is fully filled in with said polysilicon material;
   (K) (2) masking predetermined portions of said second polysilicon layer which are to remain during subsequent etching in substep (K) (3);
   (K) (3) etching away the unmasked portions of said polysilicon layer to form the gate poly connection (80);
   (K) (4) removing the mask material from the surface of said gate poly connection (80);
(L) forming a plurality of dielectric isolation regions (84) comprising the substeps of
   (L) (1) depositing blanket layer of dielectric material, preferably an oxide layer, using CVD;
   (L) (2) masking predetermined regions of the dielectric layer;
   (L) (3) etching away the unmasked portions of the blanket dielectric layer to form a plurality of dielectric isolation regions (84);
   (L) (4) removing said mask formed during substep (L) (2);
(M) forming metal gate contacts (86, 88) and metal source/drain contacts (90, 92) by depositing, patterning, and etching a first metal layer.

In another broad aspect embodying principles of the present invention, a field effect transistor having a gate-centered metal-poly contact is provided and comprises:

an active area disposed in a semiconductor substrate;

a first doped region disposed in said active area;

a second doped region disposed in said active area;

said first and second doped regions disposed at a predetermined distance defining a channel region therebetween;

a gate oxide disposed above said channel region;

a gate polysilicon region disposed adjacently above said gate oxide; and a gate metal contact disposed adjacently above said gate polysilicon region.

Principles of the present method preferably apply to the fabrication of a single field effect transistor (FET) but are adaptable to be used in fabricating a Complimentary Metal-Oxide Semiconductor transistor pair, or CMOS module, as will be discussed in the following detailed description. Furthermore, the CMOS module is adaptable to the formation of Bipolar CMOS devices (BiCMOS) and Complimentary Bipolar CMOS devices (CBiCMOS).

The present method provides for the advantageous fabrication of reduced size semiconductor devices, including short-channel (submicron) FETs, while using more common, reliable, inexpensive, relatively standard semiconductor fabrication equipment available in the industry. Short-channel length transistors are advantageous for providing high speed, low power, large scale integrated circuits having many devices on a single wafer. In particular the present method provides for the fabrication of FET devices having a submicron channel or gate length which is well below the design rule tolerance of the large design rule fabrication process to used to make the FET. In general, the design rule of a fabrication process specifies the minimum FET (or other device) feature size that can be produced using lithographic procedures based on the fabrication equipment being employed.

The present method also provides for the fabrication of the FET gate without directly employing a lithographic technique, in contrast with conventional methods. The present method therefore can be implemented using fabrication equipment which is much less expensive and is more reliable than the equipment required to fabricate similar devices wherein conventional lithographic techniques are used to define the gate length of the transistor. For example, the present method provides for the use of a standard, relatively inexpensive g-line optical stepper to form a FET with a 0.5 micron gate length using a 1 micron design rule fabrication process. Similarly, the present method is capable of producing FETs having approximately 0.3 micron channel length using a 0.8 micron design rule fabrication process.

Dopant ions are implanted into the source/drain polysilicon layer prior to the formation of a gate opening. The gate length of the FET is provided by first forming the gate opening. The gate opening is provided using standard, economical large design rule equipment, having a length of approximately 1 micron (for 1 micron design rule equipment) or approximately 0.8 micron (for 0.8 micron design rule equipment). The length of the gate opening is defined by the distance between the opposing sidewalls of the opening. Then, sidewall spacers are formed in the gate opening. The gate length is the distance between mutually facing surfaces of the spacers and is defined by subtracting the distance occupied by the two sidewall spacers (e.g., twice the spacer thickness) from the length of the gate opening. The gate oxide is subsequently grown between the sidewall spacers rather than being formed lithographically. The active regions of the FET are subsequently driven-in from the source/drain polysilicon regions into and just below the surface of the active region of the transistor. This drive-in occurs in a self-aligned manner placing the active FET regions in appropriate positions.

The present method also utilizes fewer masking steps in the fabrication of CMOS devices. Standard CMOS processes generally require four separate masks to form the N-channel threshold adjust implant, the P-channel threshold adjust implant, the NLDD regions, and the PLDD regions. The present method uses only one mask for each FET (two masks total) to form the same regions. However, the present invention utilizes an additional mask for patterning the first polysilicon (source/drain poly) layer. Overall, the present method uses three masks less than the standard CMOS fabrication process, which lowers fabrication costs and increases the production yield.

The present invention also advantageously provides a lower gate resistance nMOS or pMOS FET device by eliminating a polysilicon gate extension and forming the gate metal-polysilicon contact directly above the active polysilicon gate area. As discussed above, the prior art has generally provided for the placement of the gate metal-poly contact outside the active area of the transistor, using more area than the present layout and creating a higher gate resistance than that for the present FETs.

The present method also advantageously provides for a FET having a reduced size active area. The length of the active area is provided by the present invention to be approximately 3 microns in contrast with an approximate length of 3.5 microns for other devices. The overall active area for the present device is reduced in proportion to the reduced overall length. The reduced active area allows for a greater number of devices to be fabricated in a given wafer area.

The present method also provides for fabrication of FETs having shallow source/drain regions which exhibit relatively low resistance. The low resistance source/drain characteristics allow for higher output current drive capability of the FETs in the CMOS pair. The capacitance of the source/drain regions of the FET are also advantageously reduced. The smaller source/drain regions, stemming from the reduced overall active area 112, provide for an advantageous reduction in both the source/drain resistance and the source/drain capacitance. The smaller capacitance source/drain regions provide an increased speed capability of the FETs in the CMOS pair.

The present method also provides increased reliability in the resulting FET devices. This results partially from the use of a drive-in step (I) to form the source/drain regions and LDD regions 72, rather than the use of ion implantation, which may damage the crystal lattice structure in the region of implantation. It also results from the substantial prevention of damage to the active device region surface during the combination of etching steps provided in the present method. This reliability is reflected in relatively high chip yields and relatively low subsequent device failures (chip failures) in the field.

These and other features and advantages of the present invention will be apparent from the following detailed description, taken together with the accompanying drawings.

BRIEF DESCRIPTION OF THE DRAWINGS

FIGS. 1 through 14 are sectional fragmentary views showing successive stages in the fabrication of a CMOS transistor pair in accordance with one embodiment of the present invention, in which the fabrication proceeds in a CMOS active region;

DETAILED DESCRIPTION OF THE PREFERRED EMBODIMENT(S)

Figure 14:
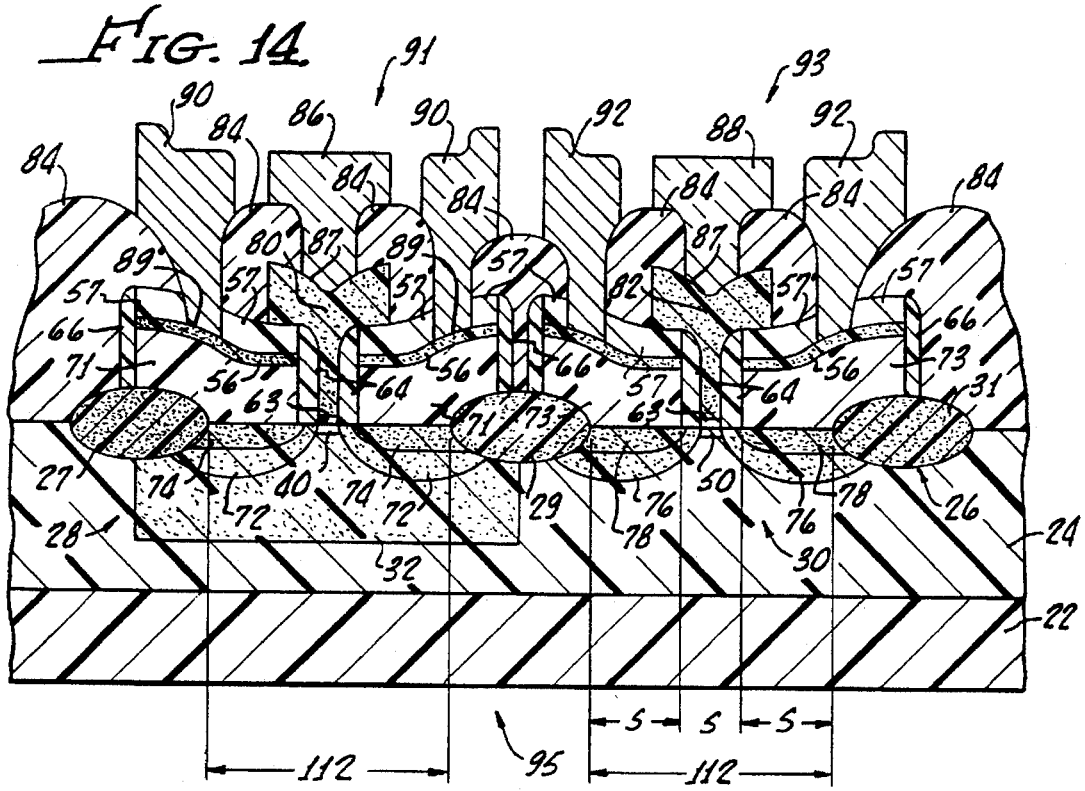

As illustrated in FIG. 14, the present method results in the fabrication of a CMOS transistor pair 95 comprising an nMOS transistor 91 (n-type metal-oxide semiconductor field effect transistor, nMOSFET, or nMOS transistor) and a pMOS transistor 93 (p-type metal-oxide semiconductor field effect transistor, pMOSFET, or pMOS transistor). Each of the nMOS and pMOS transistors 91, 93 embodies an advantageous structure over conventional field effect transistors. In particular, the FETs fabricated by the present method have a reduced active area 106 (see FIG. 17) and a channel-centered gate metal-polysilicon contact 87 (FIG. 14 and FIG. 17) in combination with more conventional FET device elements, as now described for the nMOS transistor 91. The pMOS transistor 93 has analogous features to those described for the nMOS transistor 91, as will become evident below.

Figure 1:
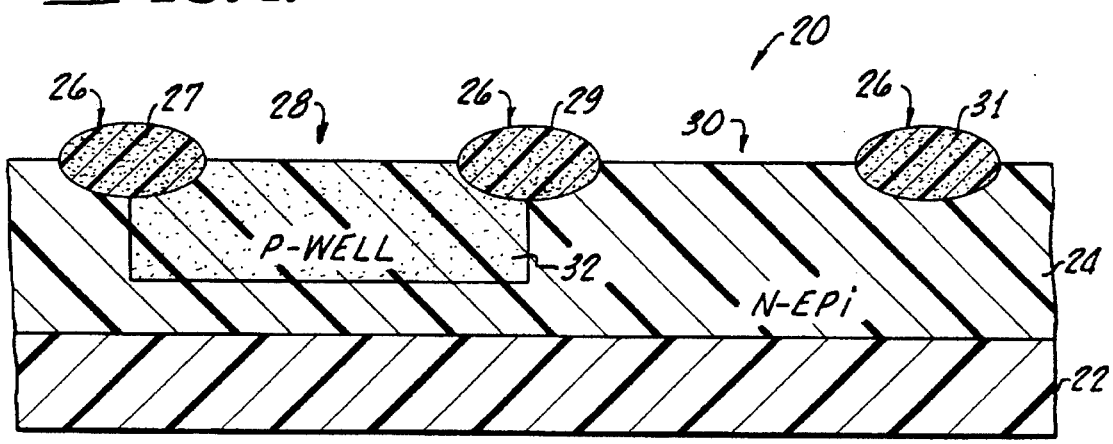
Figure 17:
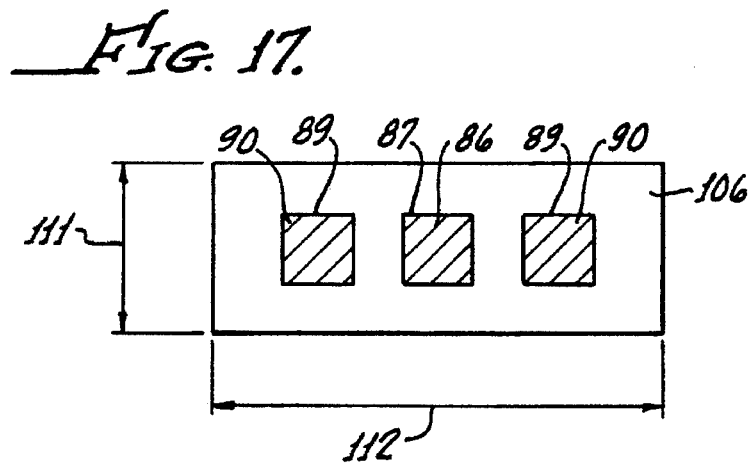
FIG. 17 illustrates symbolically a FET embodying principles of the present invention in which the overall length of the active area is substantially reduced and in which a metal-polysilicon gate contact is provided substantially above the area covered by the active device region.

As best illustrated in FIGS. 1, 14 and 17, nMOS transistor 91 is fabricated in a first active device region 28 disposed between field oxide regions 27 and 29 provided in a CMOS active region 20. Referring to FIG. 1, the CMOS active region 20 preferably incorporates an N-type semiconductor epitaxial layer 24 provided near the surface of an $N^+$-type silicon substrate 22. The field oxide regions 27 and 29 are disposed substantially near the surface of epitaxial layer 24 at a predetermined distance from each other. Referring to FIG. 17, the predetermined distance comprises the active area length 112 of the first active device region 28. An active area width 111 is also associated with the first active device region 28 in a conventional manner. Thus, first active device region 28 covers active area 106 defined by the active area length 112 times the active area width 111.

As best illustrated in FIGS. 1 and 14, for the nMOS transistor 91, a p-type semiconductor well, or P-well 32 is disposed in and substantially surrounds the first active device region 28 within the epitaxial layer 24. The P-well 32 contains the active semiconductor regions, or doped active regions of the nMOS transistor 91. For pMOS transistor 93, no well is necessary, the active semiconductor regions have complimentary semiconductor types and are formed in the epitaxial layer 24 in second active device region 30. The doped active regions for the nMOS transistor 91 include two n-type source/drain regions 74, two n-type lightly doped drain regions 72 (NLDD regions), and a threshold adjust implant region 40. As best illustrated in FIG. 11, a first gate length 68 is defined for the nMOS transistor 91 as the predetermined distance between nitride sidewall spacers 64. Also, a gate area 67 is defined for the nMOS transistor 91 as the area defined by the active area width 111 (FIG. 17) times the gate length 68 as defined by the opening between sidewall spacers 64. The channel region of the transistor is the region just below the surface of the P-well 32, substantially between the NLDD regions 72, and corresponding to the location of the gate 67 at the surface.

Figure 13:
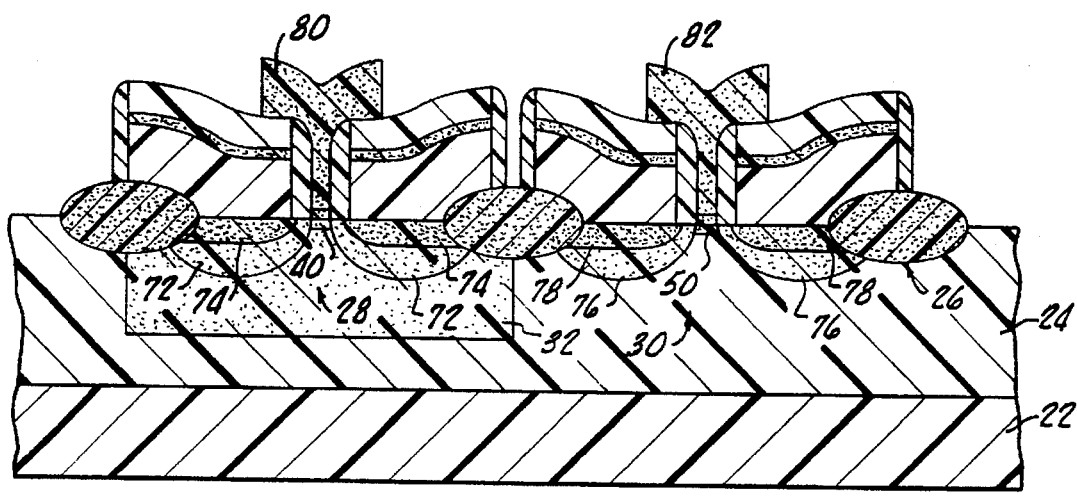

As best illustrated in FIGS. 12–14, the NLDD regions 72 and the n-type source/drain regions 74 are disposed below the surface of the active device area 28 and are symmetrically disposed on opposing edges of the first gate length 68, within P-well 32. Each source/drain region 74 is adjacent to, and makes electrical contact with, a corresponding polysilicon source/drain contact 71, wherein the upper portion of the source/drain region 74 is in contact with the lower portion of the source drain contact 71. Each source/drain region 74 is adjacent to, and makes electrical contact with, a corresponding NLDD region 72, wherein the NLDD region 72 is in contact with and substantially surrounds the lower portion of the source/drain region 74. Threshold adjust 40 is disposed in the channel region of the nMOS transistor 91 between the NLDD regions 72. Hence, the active semiconductor structures of the nMOS transistor 91 comprise the source/drain regions 74, the NLDD regions 72 and the threshold adjust implant 40, disposed in the first active device area 28 between adjacent field oxide regions 27 and 29.

Also illustrated in FIGS. 12–14 are two source/drain polysilicon contacts 71 associated with the nMOS transistor 91. A source/drain polysilicon contact 71 is disposed above, and in electrical contact with, a respective one of the source/drain regions 74. Each source/drain polysilicon contact 71 is also in contact with, and extends above an adjacent field oxide region 27 or 29, respectively. A thin silicide layer or treatment 56 is applied to the top surface of the source/drain polysilicon contacts 71. A plurality of first isolation regions 57, preferably comprising an oxide material, are disposed above each source/drain polysilicon contact 71.

A gate oxide 63 is disposed at the bottom of the gate area 67 on the surface of the epitaxial layer 24 between sidewall spacers 64. A gate polysilicon contact 80 is disposed in contact with and above the gate oxide 63. A portion of the gate polysilicon contact 80 is disposed substantially above the gate area 67. Sidewall spacers 64 and first isolation regions 57 provide electrical isolation between the gate polysilicon contact 80 and the source/drain polysilicon connections 71.

As illustrated in FIGS. 14 and 17, metal connections, leads, or contacts are provided to each of the gate polysilicon contact 80 and the source/drain polysilicon contacts 71. Each of the two source/drain contacts 90, preferably comprising metal such as aluminum, is in electrical contact with and is disposed substantially above a respective one of the source/drain polysilicon contacts 71, forming a source/drain metal-poly contact 89. The portions of the source/drain metal contacts 90 are also disposed above the field oxide regions 27, 29, respectively. The thin silicide layer or treatment 56 reduces the resistance of the metal/poly contact 89. First isolation regions 57 are disposed adjacent each source/drain metal-poly contact 89, extending upwardly from the surface of the respective source/drain polysilicon connection 71 along a portion of the respective source/drain metal contact 90. Second isolation regions 84 are disposed adjacent to and above the first isolation regions 57 and also preferably comprise an oxide layer material.

Figure 16:
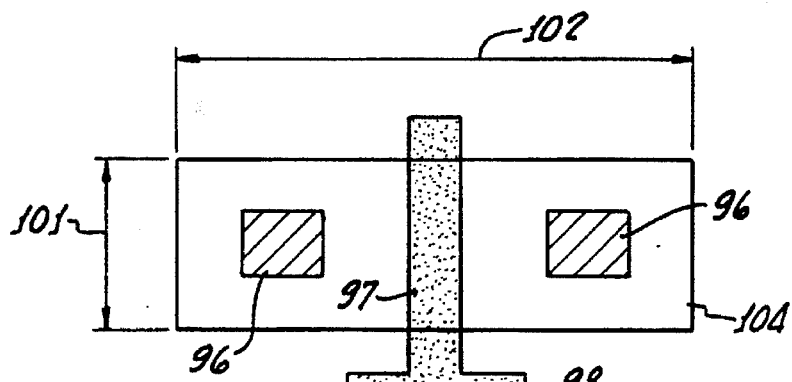
FIG. 16 illustrates symbolically a layout of a prior art FET having a metal-polysilicon gate contact provided outside the area covered by the active device region.

Also illustrated in FIGS. 14 and 17, is a significant aspect of the present invention comprising a gate metal-poly contact 87 which is substantially centered above the gate area 67. The gate poly 80 is disposed above the gate oxide 63 and the metal gate contact 86 is disposed substantially above the gate poly 80, providing gate metal-poly contact 87 substantially centered above the gate area 67 within the active area 106 (FIG. 17). Referring to FIG. 16, the prior art has generally provided for the gate metal-poly contact 100 to be provided outside the active area 104 of the transistor, using more area than the present layout, because of its greater length, and creating a higher gate resistance than that for the present FETs. The advantages of this aspect are discussed more fully below, following a detailed description of the steps illustrating principles of the present method.

As illustrated in FIG. 1, in a first step (A) the present method comprises providing an active area 20 for a complimentary metal-oxide semiconductor (CMOS) transistor pair. Step (A) further comprises the substeps of: (A) (1) forming an epitaxial layer 24 of a first conductivity type on the surface of a semiconductor substrate 22 (also of a first conductivity type); (A) (2) forming a plurality of field oxide regions 26 at predetermined distances from each other, wherein a first active device region 28 is disposed between a first field oxide region 27 and a second field oxide region 29, and wherein a second active device region 30 is disposed between the second field oxide region 29 and a third field oxide region 31; and (A) (3) forming a complimentary semiconductor region, or well 32 of a second conductivity type below the surface of the epitaxial layer 24, the well 32 being disposed in and substantially surrounding the first active device region 28.

The formation of the active area 20 for the CMOS transistor pair in step (A) is done in a conventional manner. For example, the substrate 22 preferably comprises an $N^+$ conductivity type ($N^+$-type) silicon semiconductor material formed by doping a silicon substrate with a relatively high concentration of periodic table group V impurity ions. The epitaxial layer 24 preferably comprises N-type semiconductor material (N-epi). The field oxide regions 26 are preferably formed using a conventional localized oxidation process. The device well 32 preferably comprises a P-well which is formed by doping the epitaxial layer 24 with periodic table group III impurity ions in the region comprising the first active device area 28. Alternate configurations of the CMOS active area 20 are possible, such as the possible elimination of epitaxial layer 24.

Figure 2:
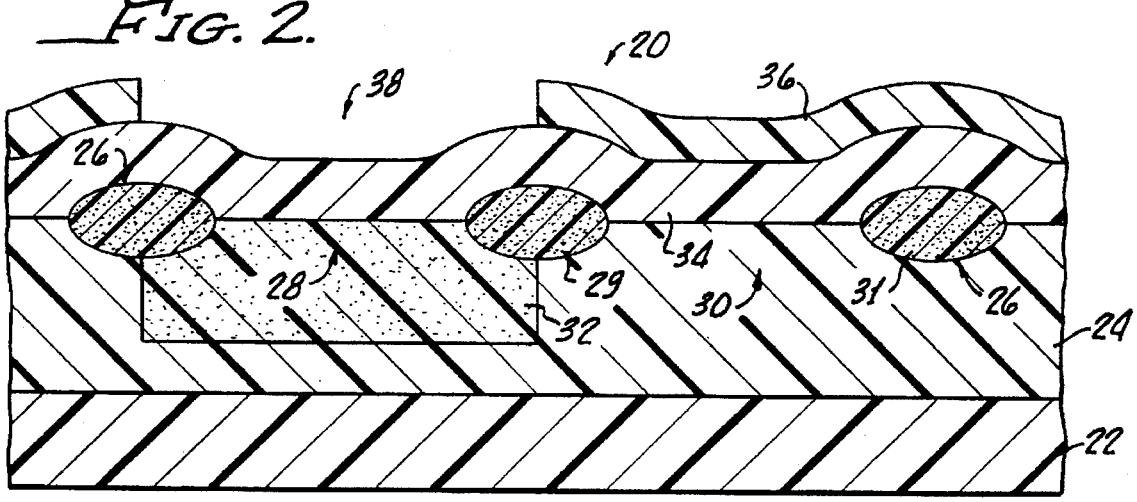

As illustrated in FIG. 2, a next step (B) preferably comprises forming a first polysilicon layer 34 on the surface of the epitaxial layer 24. The first polysilicon layer 34 is preferably deposited using chemical vapor deposition (CVD), or other suitable process. The first polysilicon layer 34 will subsequently comprise the source/drain polysilicon regions 71, 73, respectively, in the completed nMOS FET 91 and pMOS FET 93 comprising the CMOS pair 95 (shown in FIG. 14).

As illustrated in FIGS. 2–5, a next step (C) preferably comprises forming a first set of impurity ion implants, or nMOS implants, associated with the first active device region 28. Accordingly, the first active device region 28 provides the location of the nMOS transistor 91 upon the completion of the fabrication process. As illustrated in FIG. 2, in a substep (C) (1) a temporary blanket resist layer 36 (photoresist) is deposited on the surface of first polysilicon layer 34. Then in a substep (C) (2) first implant mask opening 38 is formed in photoresist 36 using a conventional patterning process and is located substantially above and centered on the first active device region 28.

Figure 3:
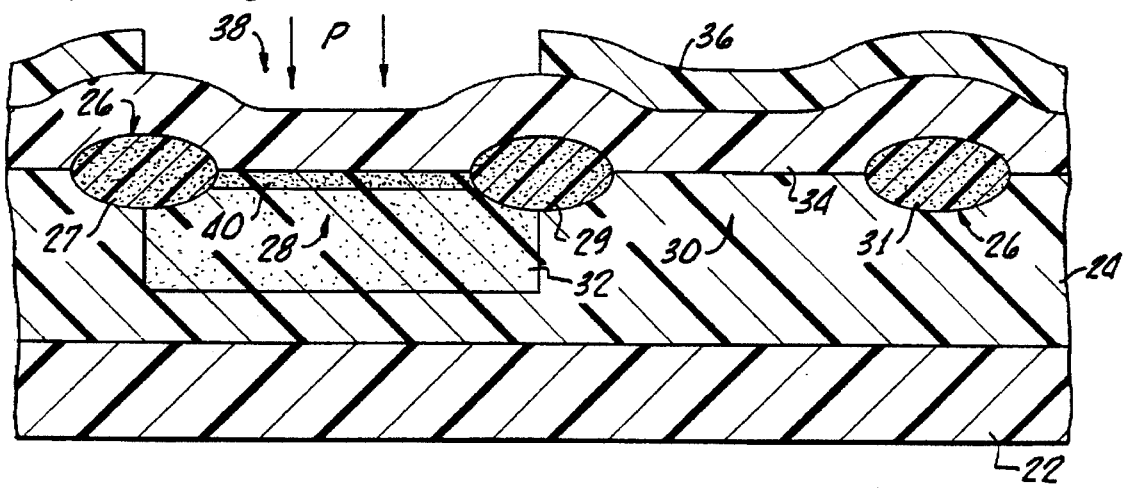

As illustrated in FIG. 3, a next substep (C) (3) comprises forming a threshold adjust implant region 40 just below the silicon surface in the P-well 32. This is preferably accomplished by implanting impurity ions of a first conductivity type (P-type) through the first implant mask opening 38, such that the ions form a relatively uniformly doped region (threshold adjust region 40) below the surface of the epitaxial layer 24 within the P-well 32. The resulting threshold adjust region 40 provides a means for predetermining the threshold voltage in the completed nMOS transistor 91 (shown in FIG. 14). The threshold adjust region 40 has a predetermined depth and concentration which is provided by controlling the energy level and ion concentration during implantation.

Figure 4:
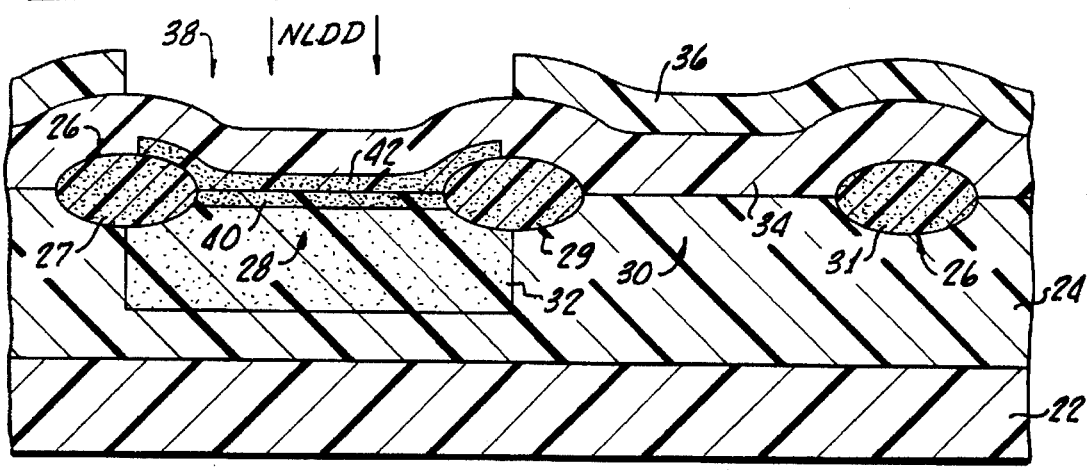

As illustrated in FIG. 4, a next substep (C) (4) comprises forming a first doped implant region, or lightly doped drain (LDD) implant region 42 in the lower portion of polysilicon layer 34. This is preferably accomplished by implanting impurity ions of a first conductivity type (N-type) through the implant mask opening 38 such that the ions form a doped implant region (NLDD implant) disposed substantially within the lower half of the polysilicon layer 34. The NLDD implant region 42 has a predetermined depth and concentration which is provided by controlling the energy level and ion concentration during implantation. The NLDD implant 42 will subsequently be driven-in during step (I) to form the NLDD regions 72 (see FIGS. 11 and 12) of the completed nMOS transistor.

Figure 5:
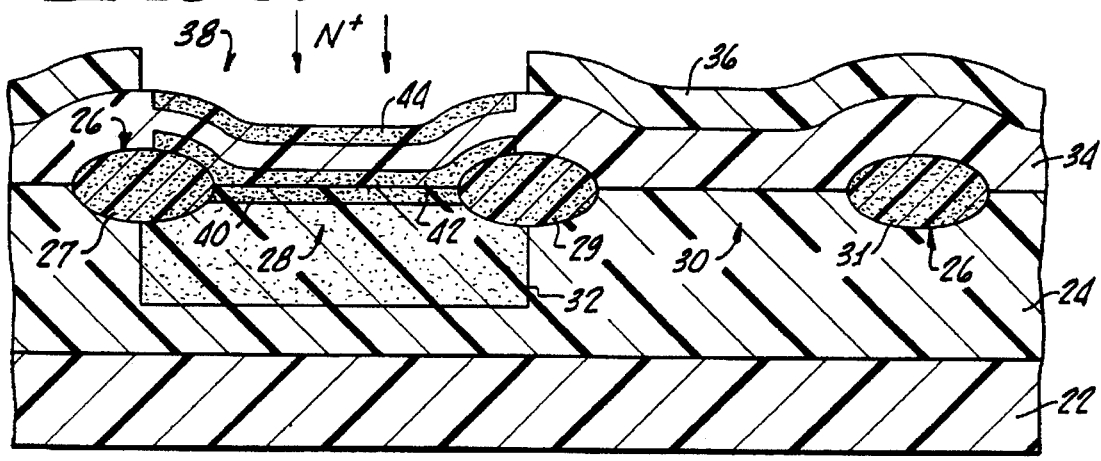

As illustrated in FIG. 5, a next substep (C) (5) comprises forming a second doped implant region, or source/drain implant region 44 in the upper portion of the polysilicon layer 34. This is preferably accomplished by implanting impurity ions of a first conductivity type ($N^+$-type) through the first implant mask opening 38 such that the ions form a doped region disposed substantially within the upper half of the polysilicon layer 34. The $N^+$-source/drain implant 44 has a predetermined depth and concentration which is provided by controlling the energy level and ion concentration during implantation. The $N^+$-source/drain implant region 44 will subsequently be driven-in during step (I) to form the source/drain regions 74 (see FIG. 12) of the completed nMOS transistor 91 (see FIG. 14). Finally, a substep (C) (6) (not illustrated) comprises removing the photoresist coating 36 from the surface of the polysilicon layer 34, which is accomplished in a conventional fashion.

Figure 6:
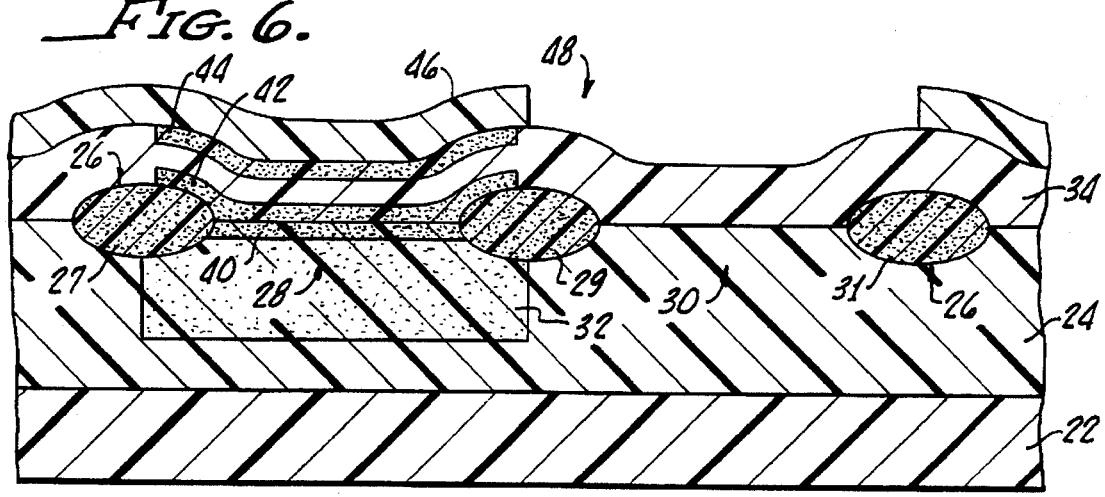

As illustrated in FIGS. 6–9, a next step (D) preferably comprises forming a second set of impurity ion implants, or pMOS implants, associated with the second active device region 30. Accordingly, the second active device region 30 provides the location of the pMOS transistor 93 upon the completion of the fabrication process. As illustrated in FIG. 6, in a substep (D) (1) a temporary blanket resist layer 46 (photoresist) is deposited on the surface of first polysilicon layer 34. Then in a substep (D) (2) second implant mask opening 48, disposed above and centered on the second active device region 30, is formed in photoresist 46 using a conventional patterning process.

As illustrated in FIG. 7, a next substep (D) (3) comprises forming a threshold adjust implant region 50 just below the silicon surface in the epitaxial layer 24. This is preferably accomplished by implanting impurity ions of a second conductivity type (P-type) through the second implant mask opening 48, such that the ions form a relatively uniformly doped region below the surface of the epitaxial layer 24. This forms the threshold adjust region 50 which provides a means for predetermining the threshold voltage in the completed pMOS transistor 93. The threshold adjust region 50 has a predetermined depth and concentration which is provided by controlling the energy level and ion concentration during implantation.

As illustrated in FIG. 8, a next substep (D) (4) comprises forming a third doped implant region, or lightly doped drain (LDD) implant region 42 in the lower portion of polysilicon layer 34. This is preferably accomplished by implanting impurity ions of a second conductivity type (P-type) through the implant mask opening 48 such that the ions form a doped implant region 52 (PLDD implant) disposed substantially within the lower half of the polysilicon layer 34. The PLDD implant region 52 has a predetermined depth and concentration which is provided by controlling the energy level and ion concentration during implantation. The PLDD implant 52 is subsequently driven-in during step (I) to form the PLDD regions 76 (see FIGS. 11 and 12) of the completed pMOS transistor.

As illustrated in FIG. 9, a next substep (D) (5) comprises forming a fourth doped implant region, or source/drain implant region 44 in the upper portion of the polysilicon layer 34. This is preferably accomplished by implanting impurity ions of a second conductivity type (P⁺-type) through the second implant mask opening 48 such that the ions form a doped region disposed substantially within the upper half of the polysilicon layer 34. The P⁺-source/drain implant 54 has a predetermined depth and concentration which is provided by controlling the energy level and ion concentration during implantation. The P⁺-source/drain implant region 54 is subsequently driven-in during step (I) to form the source/drain regions 78 (see FIGS. 11 and 12) of the completed pMOS transistor. Finally, a substep (D) (6) (not illustrated) comprises removing the photoresist coating 46 from the surface of the polysilicon layer 34, which is accomplished in a conventional fashion.

Referring to FIG. 10, the CMOS device structure is shown at an intermediate stage after completion of steps (E), (F) and (G), which are described as follows. Step (E) comprises forming a thin silicide layer 56 on the surface of the polysilicon layer 34 to reduce its resistance. This is accomplished by a conventional silicidation process resulting in a silicided polysilicon layer 34. Step (F) follows step (E) and comprises forming a first dielectric layer 58 on the surface of the silicided polysilicon layer 34. The first dielectric layer 58 is preferably deposited during step (F) as a blanket layer of oxide material using CVD. When the nMOS and pMOS transistors 91, 93 (FIG. 14) are complete the remaining portions 57 of the first dielectric layer 58 provide electrical isolation between the gates 80, 82 (see FIG. 13) and the source/drain polycontact regions 71, 73, respectively.

Still referring to FIG. 10, a next step (G) comprises forming first gate opening 60 and second gate opening 62 through the dielectric layer 58 and the polysilicon layer 34. Field region openings 59 are also formed during this step. The openings 60 and 62 are provided in a set of substeps, the first being substep (G) (1) of forming a temporary resist mask (not shown) defining the location of the gate openings 60, 62 substantially in the center of the first active device area 28, and in the center of the second active device area 30, respectively.

Then substep (G) (2) comprises etching through the dielectric layer 58 and a substantial portion of the polysilicon layer 34, at the center opening of the temporary resist mask, using a dry etch endpoint procedure. The endpoint procedure leaves a relatively thin remaining portion of polysilicon layer 34 in the gate openings above the surface of the respective active device regions 28, 30. This procedure prevents damage to the active device areas 28, 30 from the dry etch process.

Substep (G) (3) comprises removing the temporary resist (not shown). Substep (G) (4) comprises forming an oxide by converting the thin remaining portion of said polysilicon layer 34 in the bottom of the respective gate opening 60, 62 into silicon dioxide using thermal oxidation. Next, substep (G) (5) comprises etching away a substantial portion of the converted oxide from the thin remaining portions of the polysilicon layer 34 using a dry oxide etch to preserve the substantially vertical wall profile of the layers providing the sides of respective gate openings 60, 62. Then, substep (G) (6) comprises etching away the thin remaining portions of the oxide from the thin remaining portion of the polysilicon layer 34 in the respective gate openings 60, 62, using a wet etch solution in which the respective channel surfaces of the respective active device regions 28, 30 are substantially undamaged by the etch solution. After completion of substep (G) (6) the resulting semiconductor structure is as shown in FIG. 10.

As illustrated in FIG. 11, a next step (H) comprises forming sidewall spacers 64 defining the first gate length 68 of the first active device 28 and the second gate length 70 of the second active device 30, respectively. These spacers decrease the gate length in gate opening 60. Step (H) also results in the formation of the isolation spacers 66 at the edges of the respective nMOS and pMOS transistors above the field oxide regions 26. The isolation spacers 66 provide electrical isolation from adjacent devices or structures on the semiconductor wafer.

Preferably, step (H) comprises the following substeps. Substep (H) (1) comprises forming a thin oxide layer on top of the silicon layer in the respective gate openings 60, 62. Substep (H) (2) comprises forming a blanket nitride layer (not shown) sufficient to fill in the gate openings 60, 62. The blanket nitride layer is preferably deposited using CVD or other suitable process. Then, substep (H) (3) comprises etching away said blanket nitride layer using anisotropic dry etch thereby forming the sidewall spacers 64 from the remaining portions of said blanket nitride layer and using said thin oxide layer formed in substep (H) (1) as a stop etch layer. Isolation regions 66, located above the field oxide regions, are also formed from the blanket nitride layer during step (H).

Also illustrated in FIG. 11, by the arrows labeled 'I', a next step (I) comprises simultaneously (1) driving-in the first and second doped implant regions 42 and 44 from the polysilicon layer 34 into the first device region 28 to form first lightly doped drain regions 72 (NLDD regions) and first source-drain regions 74 (N⁺-source/drain regions), respectively, and (2) driving-in the third and fourth doped implant regions 52 and 54 from the polysilicon layer 34 into the second active device region 30 to form second lightly doped drain regions 74 (PLDD regions) and second source-drain regions 76 (P⁺-source/drain regions), respectively. The resulting LDD regions 72, 76 and source/drain regions 74, 78 are shown in FIG. 12.

As illustrated in FIG. 12, the resulting NLDD regions 72 and source/drain regions 74 are disposed below the surface of the active device area 28 symmetrically situated on opposing edges of the first gate length 68, within P-well 32. Each source/drain region 74 is adjacent to, and makes electrical contact with, a corresponding polysilicon source/drain contact 71, wherein the upper portion of the source/drain region 74 is in contact with the lower portion of the source drain contact 71. Each source/drain region 74 is adjacent to, and makes electrical contact with, a corresponding NLDD region 72, wherein the NLDD region 72 is in contact with and substantially surrounds the lower portion of the source/drain region 74. Threshold adjust 40, previously formed during substep (C) (3), is disposed in the channel region of the nMOS transistor between the NLDD regions 72. Hence, the active semiconductor structures of the nMOS transistor 91 are shown in FIG. 12, comprising the source/drain regions 74, the NLDD regions 72 and the threshold adjust implant 40, disposed in the first active device area 28 between adjacent field oxide regions 27 and 29.

Similarly, also illustrated in FIG. 12 for the pMOS transistor 93 the resulting PLDD regions 76 and source/drain regions 78 (after drive-in step (I)) are disposed below the surface of the active device area 30 symmetrically situated on opposing edges of the second gate length 70, within the epitaxial layer 24. Each source/drain region 78 is adjacent to, and makes electrical contact with, a corresponding polysilicon source/drain contact 73, wherein the upper portion of the source/drain region 78 is in contact with the lower portion of the source drain contact 73. Each source/drain region 78 is adjacent to, and makes electrical contact with, a corresponding PLDD region 76, wherein the PLDD region 76 is in contact with and substantially surrounds the lower portion of the source/drain region 78. Threshold adjust 50, previously formed during step (D) (3), is disposed in the channel region of the pMOS transistor between the PLDD regions 76. Hence, the active semiconductor structures of the pMOS transistor 93 are shown in FIG. 12, comprising the source/drain regions 78, the PLDD regions 76 and the threshold adjust implant 50, disposed in the second active device area 30 between adjacent field oxide regions 29 and 31.

After step (I), the next step (J) comprises simultaneously growing first gate oxide 63 between the sidewall spacers 64 on the channel surface above the P-well 32, and growing second gate oxide 65 between the sidewall spacers 64 on the channel surface above the epitaxial layer 24. Preferably, step (J) comprises the substeps of (J) (1) growing a thin sacrificial oxide layer (not shown) on the channel surface at the bottom of each gate area 67 and 69; (J) (2) etching away the sacrificial oxide layer using a hydrofluoric acid solution; and (J) (3) growing the first gate oxide 63 and the second gate oxide 64 on the channel surface at the bottom of each gate area 67 and 69, respectively, using thermal oxidation or other suitable process.

As illustrated in FIG. 13, a next step (K) comprises forming the first and second polysilicon gates 80, 82. Preferably, the gates 80, 82 are formed using the substeps of (K) (1) depositing a second blanket layer of polysilicon material over the exposed wafer surface using CVD or other suitable process, so that the respective gate areas 67 and 69 are fully filled in with polysilicon material. Then substep (K) (2) comprises masking predetermined regions of the polysilicon layer which are to remain during subsequent etching. Next, substep (K) (3) comprises etching away the unmasked portions of the polysilicon layer to form first gate 80 and second gate 82 as shown in FIG. 13.

As illustrated in FIG. 14, the CMOS transistor pair is completed in two steps (L) and (M), wherein step (L) comprises forming dielectric isolation regions 84 and step (L) comprises forming metal gate contacts 86, 88 and metal source/drain contacts 90, 92. Step (L) preferably comprises the substeps of (L) (1) depositing blanket layer of dielectric material, preferably an oxide layer, using CVD or other suitable process; (L) (2) masking predetermined regions of the dielectric layer; and (L) (3) etching away the unmasked portions of the blanket dielectric layer to form dielectric isolation regions 84, substantially as shown in FIG. 14.

Step (M) comprises forming metal gate contacts 86, 88 and metal source/drain contacts 90, 92, to provide electrical terminals to the nMOS and pMOS transistors. The nMOS source/drain metal contacts 90 and the pMOS source/drain metal contacts 92 are formed in a conventional manner by depositing, patterning, and etching a first metal layer. The gate metal contacts 86 and 88 are also formed in the first metal layer simultaneously with the source/drain metal contacts 90, 92. However, the present method provides for the formation of each gate metal contact 86, 88 directly above, centered on, and in electrical contact with, the gate poly connections 80, 82, respectively, as shown in FIG. 14 and also FIG. 17.

The prior art has generally provided for the formation of the gate metal contact 100 only above the gate field region 98, as shown in FIG. 16. This requires that a strip, lead, or extension of the gate polysilicon 97 be extended beyond the active area 104 of the semiconductor device in order to make the gate poly-metal connection outside the active area 104. The resistance of polysilicon material is relatively high, and increases in proportion to the length of the particular strip or lead. As illustrated in FIGS. 14 and 17, the present invention advantageously provides a lower gate resistance nMOS or pMOS device by eliminating the polysilicon gate extension and forming the gate contact 86 (FIG. 17) directly above the active polysilicon gate area 80 (FIG. 14, hidden in FIG. 17). However, the present method can alternatively be implemented with the gate metal contacts 86, 88 formed in a conventional configuration.

The steps of the foregoing method provide numerous advantages which will now be described, with reference to a single FET device in the CMOS pair (the nMOS transistor) to provide clarity. However, the principles and advantages of the present method also apply to the pMOS transistor described above as well as to other semiconductor devices.

The present invention provides a short-channel FET having a relatively short gate length 60 (and correspondingly short-channel length) compared to the minimum lithographically producible feature size of the equipment used to make the FET. In other words, a relatively large design rule process is used to fabricate a FET having a channel length which is well below the design rule tolerance. This provides for the production of high performance semiconductor devices using existing, standard, relatively inexpensive fabrication equipment.

The gate length 68 of the FET is provided by first forming the gate opening 60. The gate opening 60 is provided using standard, economical equipment, having a length of approximately 1 micron (for 1 micron design rule equipment) or approximately 0.8 micron (for 0.8 micron design rule equipment). The length of the gate opening 60 is defined by the distance between the opposing sidewalls of the opening. Then, the sidewall spacers 64 are formed in the gate opening 60, wherein the gate length 68 is defined by subtracting the distance occupied by the two sidewall spacers 64 from the length of the gate opening 60.

The gate oxide 63 is then grown between the sidewall spacers 64 rather than being formed lithographically.

Using standard equipment providing for a 1 micron design rule fabrication process, the present method can produce FETs having a gate length 68 of approximately 0.4 to 0.6 microns. Using standard equipment providing for a 0.8 micron design rule fabrication process, the present method can produce FETs having a gate length 68 of approximately 0.2 to 0.4 microns. Conventional techniques require significantly more expensive equipment in order to form FETs having comparable gate lengths.

The present method also utilizes fewer masking steps in the fabrication of CMOS devices. Standard CMOS processes generally require four separate masks to form the N-channel threshold adjust implant, the P-channel threshold adjust implant, the NLDD regions, and the PLDD regions. The present method uses only one mask for each FET (two masks total) to form the same regions. However, the present invention utilizes an additional mask for patterning the first polysilicon (source/drain poly) layer. Overall, the present method uses three masks less than the standard CMOS fabrication process, which lowers fabrication costs and increases the production yield.

The present method also advantageously provides for a FET having a reduced size active area. Referring to FIG. 14, and particularly to the pMOS transistor 30, the length of the active area is defined by three substantially equal distances "S". A first distance "S" comprises the length of the gate opening 70. A second distance "S" comprises the distance between the field oxide region 29 and the closest edge of the gate opening 70. A third distance "S" comprises the distance between the field oxide region 31 and the closest edge of the gate opening 70. The present method provides for each distance "S" to be approximately 1 micron in length, thus the overall length of the active area spans a distance of approximately 3 microns. The active area length 112 is indicated in the transistor design layout diagram of FIG. 17.

Figure 15:
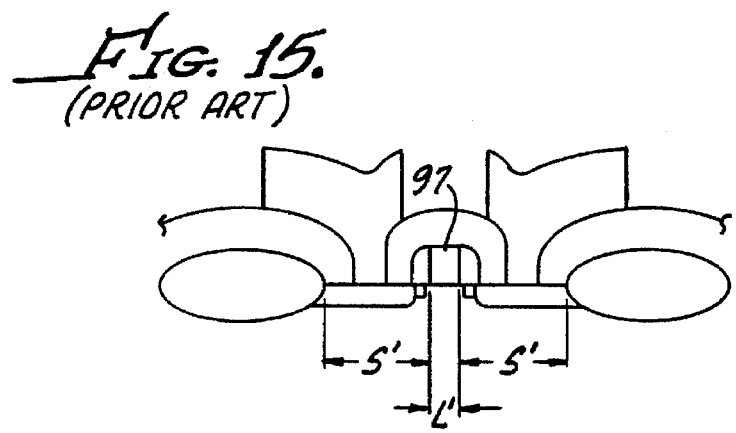
FIG. 15 illustrates a prior art field effect transistor (FET)

The overall active area 106 for the present device is defined by the device width 111 times the active area length 112. This is approximately 14% (fourteen percent) smaller than the active area 104 (FIG. 16) of prior art devices, due to the shorter overall length. As illustrated in FIG. 15, the overall length of a prior art FET comprises the gate length L' added to the length of two source/drain regions S', which is approximately 3.5 microns all totalled. This overall active area length 102 for a prior art FET is indicated in FIG. 16. The smaller active area 106 of the present invention allows for a greater number of devices to be fabricated in a given wafer area, and also contributes to the advantages discussed below.

The present method also provides the fabrication of FETs having shallow source/drain regions 74 which exhibit relatively low resistance. The low resistance results in part from the silicided connection of the source/drain polysilicon regions 71, 73 to the source/drain metal contacts 90, 92. The low resistance source/drain characteristics allow for higher output current drive capability of the FETs in the CMOS pair.

The capacitance of the source/drain regions 74 of the FET are also advantageously reduced. This results from the smaller source/drain regions 74 stemming from the reduced overall active area 112. The smaller capacitance source/drain regions 74 provide an increased speed capability of the FETs in the CMOS pair.

The present method also provides increased reliability in the resulting FET devices. This results partially from the use of a drive-in step (I) to form the source/drain regions 74 and LDD regions 72, rather than the use of ion implantation. It also results from the substantial prevention of damage to the active device region surface during the combination of etching steps provided in the present method. This reliability is reflected in relatively high chip yields and relatively low subsequent device failures (chip failures) in the field.

Although the foregoing description explains the detailed steps for fabricating a CMOS transistor pair 20 (i.e., simultaneously fabrication both an nMOS and a pMOS transistor), the present method is also adaptable to the formation of a single FET transistor or different configurations of FET transistors. Accordingly, simplified outline of the steps for fabricating a FET transistor in accord with principles of the present invention is as follows, wherein the steps and numerals apply particularly to the nMOS transistor 91 (shown in FIG. 14).

A method of making a semiconductor device, comprises the steps of:

(A) providing an active area (28) comprising a semiconductor substrate (22);
an epitaxial layer (24) of a first conductivity type disposed on a surface of said semiconductor substrate (22);
at least two field oxide regions (26) disposed at a predetermined distance from each other substantially on the surface of said epitaxial layer (34) providing an active device region (28) therebetween; and
a well (32) of a second conductivity type being disposed substantially surrounding said active device region;

(B) forming a first polysilicon layer (34) on the surface of said epitaxial layer (24);

(C) forming a plurality of impurity ion implants associated with said active device region comprising the substeps of
(C) (1) forming a temporary blanket resist layer (36) on the surface of said first polysilicon layer (34);
(C) (2) forming an implant mask opening (38) in said resist mask layer (36) disposed substantially above said active device region (28);
(C) (3) implanting impurity ions of a first conductivity type (N-type) through said implant mask opening (38) to form threshold adjust region (40) below the surface of said epitaxial layer (24) within said well (32);
(C) (4) implanting impurity ions of a first conductivity type (N-type) through said implant mask opening (38) such that the ions form a first doped implant region (42) disposed substantially within the lower half of said polysilicon layer (34);
(C) (5) implanting a relatively high concentration of impurity ions of a first conductivity type ($N^+$-type) through said implant mask opening (38) such that said ions form a second doped implant region (44) disposed substantially within the upper half of said polysilicon layer (34);
(C) (6) removing the remaining resist layer material (36) from the surface of the polysilicon layer (34);

(E) forming a thin silicide layer (56) the surface of said polysilicon layer (34);

(F) forming a first dielectric layer (58) on the surface of said silicided polysilicon layer (34);

(G) forming a gate opening (60) through said dielectric layer (58) and said polysilicon layer (34), said gate opening being substantially centered in said active device region (28), comprising the substeps of
(G) (1) forming a temporary resist mask on the surface of said dielectric layer (58) defining the location of said gate opening (60) substantially in the center of said active device region (28);
(G) (2) etching through the dielectric layer (58) and a substantial portion of the polysilicon layer (34), leaving a relatively thin portion of said polysilicon layer remaining in said gate opening (60) above the surface of said active device region (28);
(G) (3) removing said temporary resist mask from the surface of said dielectric layer (58);
(G) (4) forming an oxide by converting said thin remaining portion of polysilicon layer (34) in the bottom of said gate opening (60, 62) into silicon dioxide using thermal oxidation;
(G) (5) etching away said oxide from said thin remaining portion of said polysilicon layer (34) using a dry oxide etch to even out the planar surface of said thin remaining portion of said polysilicon layer (34);
(G) (6) etching away said thin remaining portions of polysilicon layer (34) in said gate opening (60, 62) using a wet etch solution in which the surface of the active device region (28, 30) is substantially undamaged by the etch solution;

(H) forming at least two sidewall spacers (64) disposed in said gate opening (60) having a predetermined distance therebetween, said predetermined distance defining a gate length (68) which in conjunction with a predetermined device width (111) defines a gate area (67) on said active device region (28) surface, comprising the substeps of (H) (1) forming a thin oxide layer on top of the silicon layer in the gate opening (60);

(H) (2) forming a blanket nitride layer sufficient to fill in the gate openings (60);

(H) (3) etching away portions of said blanket nitride layer using anisotropic dry etch thereby forming said sidewall spacers (64) from the remaining portions of said blanket nitride layer using said thin oxide layer formed in substep (H) (1) as a stop etch layer;

(I) simultaneously driving-in said first and second doped implant regions (42 and 44) from said polysilicon layer (34) into said active device region (28) to form lightly doped drain regions (72) and source-drain regions (74), respectively;

(J) forming a gate oxide region (63) disposed between said sidewall spacers (64) on the surface of said epitaxial layer (24), comprising the substeps of (J) (1) growing a thin sacrificial oxide layer on said epitaxial layer (24) surface corresponding to said gate area (67);

(J) (2) etching away said sacrificial oxide layer using a hydrofluoric acid solution; and (J) (3) growing said gate oxide (63) on said epitaxial layer (24) surface corresponding to said gate area (67) using thermal oxidation;

(K) forming a polysilicon gate connection (80), comprising the substeps of (K) (1) depositing a second blanket layer of polysilicon material using CVD so that the gate area (67) is fully filled in with said polysilicon material;

(K) (2) masking predetermined portions of said second polysilicon layer which are to remain during subsequent etching in substep (K) (3);

(K) (3) etching away the unmasked portions of said polysilicon layer to form said gate poly connection (80);

(K) (4) removing the mask material from the surface of said gate poly connection (80);

(L) forming a plurality of dielectric isolation regions (84) comprising the substeps of (L) (1) depositing blanket layer of dielectric material, preferably an oxide layer, using CVD;

(L) (2) masking predetermined regions of the dielectric layer;

(L) (3) etching away the unmasked portions of the blanket dielectric layer to form a plurality of dielectric isolation regions (84);

(L) (4) removing said mask formed during substep (L) (2);

(M) forming metal gate contact (86) and metal source/drain contacts (90) by depositing, patterning, and etching a first metal layer.

The pMOS transistor 93 is fabricated in an analogous manner using complementary types of semiconductor materials. While particular illustrative embodiments of the invention have been shown and described, numerous variations and alternative embodiments are possible. Accordingly, it is intended that the invention be limited only in terms of the appended claims.

What is claimed is:

1. A method of making a semiconductor device structure, using fabrication equipment having a design rule value, comprising the steps of:

(A) providing an active area for a semiconductor device, said active area including an active device region of a first conductivity type, and having a surface thereon;

(B) forming a first polysilicon layer above said active device region surface;

(C) forming a mask layer above said first polysilicon layer, said mask including openings in positions above said active area, and implanting impurity ions into said polysilicon layer to form a plurality of doped implant region therein, comprising the substeps of:

(C) (1) forming a temporary blanket resist layer on the surface of said first polysilicon layer;

(C) (2) forming an implant mask opening in said resist mask layer disposed substantially above said active device region;

(C) (3) implanting a first concentration of impurity ions of a complementary conductivity type to said first conductivity type through said implant mask opening to form a threshold adjust region below the surface of said active device region;

(C) (4) implanting a second concentration of impurity ions of a complementary conductivity type to said first conductivity type through said implant mask opening such that the ions form a first doped implant region disposed substantially within the lower portion of said polysilicon layer;

(C) (5) implanting a third concentration of impurity ions of a second conductivity type through said implant mask opening such that said ions form a second doped implant region disposed substantially within the upper portion of said polysilicon layer;

(C) (6) removing the remaining resist layer after said step C (2) from the surface of the polysilicon layer;

(F) forming a first dielectric layer above said polysilicon layer;

(G) forming a gate opening through said polysilicon layer and said dielectric layer in a position above said active area using an etch process, said gate opening being defined between a pair of opposing sidewalls and having dimensions within said design rule value; and (H) forming at least two dielectric spacers on said opposing sidewalls of said gate opening, said dielectric spacers being spaced from one another at a distance that defines a device gate length that is smaller than said design rule value.

2. The method of claim 1, wherein said step of providing an active area of step (A) further comprises:

providing a semiconductor substrate (22);

forming an epitaxial layer (24) of said first conductivity type disposed on a surface of said semiconductor substrate (22); and forming at least two field oxide regions (26) disposed at a distance from each other substantially on the surface of said epitaxial layer (34) providing said active device region (28) therebetween.

3. The method of claim 1, further including a step (E) between steps (C) and (F) comprising:

(E) forming a silicide layer on the surface of said polysilicon layer.

4. The method of claim 1 wherein step (G) further comprises the substeps of (G) (1) forming a temporary resist mask on the surface of said dielectric layer thereby defining the location of said gate opening substantially in the center of said active device region;

(G) (2) etching through the dielectric layer and a substantial portion of the polysilicon layer, leaving a thinned portion of said polysilicon layer remaining in said gate opening above the surface of said active device region;

(G) (3) removing said temporary resist mask from the surface of said dielectric layer;

(G) (4) forming an oxide by converting said thinned remaining portion of said polysilicon layer in the bottom of said gate opening into silicon dioxide using thermal oxidation;

(G) (5) etching away said oxide from said thinned remaining portion of said polysilicon layer using a dry oxide etch to even out the surface of said thinned remaining portion of said polysilicon layer;

(G) (6) etching away said thinned remaining portions of said polysilicon layer in said gate opening using a wet etch solution in which the surface of the active device region is substantially undamaged by the etch solution.

5. The method of claim 1 in which step (H) further comprises the substeps of:

(H) (1) forming an oxide layer on top of the silicon layer in the gate opening;

(H) (2) forming a blanket nitride layer sufficient to fill in the gate openings;

(H) (3) etching away portions of said blanket nitride layer using an anisotropic dry etch thereby forming said sidewall spacers from the remaining portions of said blanket nitride layer using said oxide layer formed in substep (H) (1) as an etch stop layer.

6. The method of claim 2, in which said active area of step (A) further comprises a well of said second conductivity type disposed in said spitaxial layer and substantially providing said active device region.

7. The method of claim 1, further including a step (I) following step (H), step (I) comprising the substeps of:

(I) simultaneously driving-in said first and second doped implant regions from said polysilicon layer into said active device region to form active device regions including lightly doped drain regions and source-drain regions, respectively, said active regions being disposed on opposing sides of said gate length and being respectively aligned with the opposing ends thereof.

8. The method of claim 7, further including steps (J), (K), (L) and (M) following step (I), said steps comprising:

(J) forming a gate dielectric region disposed between said sidewall spacers on the surface of said epitaxial layer, comprising the substeps of (J) (1) growing a sacrificial oxide layer on the exposed surface at the bottom of said gate opening;

(J) (2) etching away said sacrificial oxide layer using a hydrofluoric acid solution; and (J) (3) growing said gate oxide on said exposed surface at the bottom of said gate opening using thermal oxidation;

(K) forming a polysilicon gate comprising the substeps of (K) (1) depositing a second blanket layer of polysilicon material using CVD so that the gate opening is fully filled in with said polysilicon material;

(K) (2) masking portions of said second polysilicon layer which are to remain during subsequent etching in substep (K) (3);

(K) (3) etching away the unmasked portions of said polysilicon layer to form a gate polysilicon contact;

(K) (4) removing the mask material form the surface of said gate polysilicon contact;

(L) forming a plurality of dielectric isolation regions comprising the substeps of (L) (1) depositing a blanket layer of dielectric material, preferably an oxide layer, using CVD;

(L) (2) masking regions of the dielectric layer;

(L) (3) etching away the unmasked portions of the blanket dielectric layer to form a plurality of dielectric isolation regions;

(L) (4) removing said mask formed during substep (L) (2);

(M) forming a metal gate contact and metal source/drain contacts by depositing, patterning, and etching a first metal layer.

* * * * *